(12) United States Patent
Tsujita et al.

(10) Patent No.: US 6,916,749 B2
(45) Date of Patent: Jul. 12, 2005

(54) METHOD OF MANUFACTURING SEMICONDUCTOR DEVICE

(75) Inventors: Kouichirou Tsujita, Tokyo (JP); Akihiro Nakae, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 39 days.

(21) Appl. No.: 10/384,572

(22) Filed: Mar. 11, 2003

(65) Prior Publication Data

US 2004/0087044 A1 May 6, 2004

(30) Foreign Application Priority Data

Oct. 31, 2002 (JP) ........................................ 2002-317583

(51) Int. Cl.[7] .............................................. H01L 21/31
(52) U.S. Cl. ...................... 438/758; 438/763; 438/781
(58) Field of Search ................................. 438/758, 763, 438/781; 385/42

(56) References Cited

U.S. PATENT DOCUMENTS

| | | | |
|---|---|---|---|
| 5,872,054 A | 2/1999 | Tsujita | |
| 6,297,521 B1 * | 10/2001 | Forbes et al. | 257/76 |
| 6,670,425 B2 * | 12/2003 | Puligadda et al. | 525/327.3 |
| 6,684,007 B2 * | 1/2004 | Yoshimura et al. | 385/31 |
| 6,690,845 B1 * | 2/2004 | Yoshimura et al. | 385/14 |
| 6,706,546 B2 * | 3/2004 | Yoshimura et al. | 438/31 |
| 6,785,447 B2 * | 8/2004 | Yoshimura et al. | 385/42 |
| 2002/0123245 A1 | 9/2002 | Tsujita et al. | |

FOREIGN PATENT DOCUMENTS

| | | |
|---|---|---|
| JP | 07-037799 | 2/1995 |
| JP | 10-270329 | 10/1998 |
| JP | 2002-214793 | 7/2002 |
| TW | 396401 | 10/1987 |

OTHER PUBLICATIONS

K.-J. Shim, et al., Spie, vol. 3334, pp. 692–701, "Optimization of ARC Process in DUV Lithography", 1998 (missing pp. 693, 695 and 697 to be filed later).

* cited by examiner

Primary Examiner—Michael S. Lebentritt
Assistant Examiner—Olivia T. Luk
(74) Attorney, Agent, or Firm—Oblon, Spivak, McClelland, Maier & Neustadt, P.C.

(57) ABSTRACT

A multilayer structure which provides for optimization of a configuration of a patterned photoresist is designed. A multilayer structure (20) includes polysilicon (10), a silicon oxide film (11) and an anti-reflective film (12) which are deposited sequentially in the order noted, and a photoresist (13) is provided on the anti-reflective film (12), so that light for exposure is incident on the multilayer structure (20) through the photoresist (13). First, as a step (i), a range of thickness of the silicon oxide film (11) is determined so as to allow an absolute value of a reflection coefficient of the light for exposure at an interface between the anti-reflective film (12) and the photoresist (13) to be equal to or smaller than a first value. Subsequently, as a step (ii), the range of thickness of the silicon oxide film (11) determined in the step (i) is delimited so as to allow an absolute value of a phase of the reflection coefficient to be equal to or larger than a second value.

8 Claims, 18 Drawing Sheets

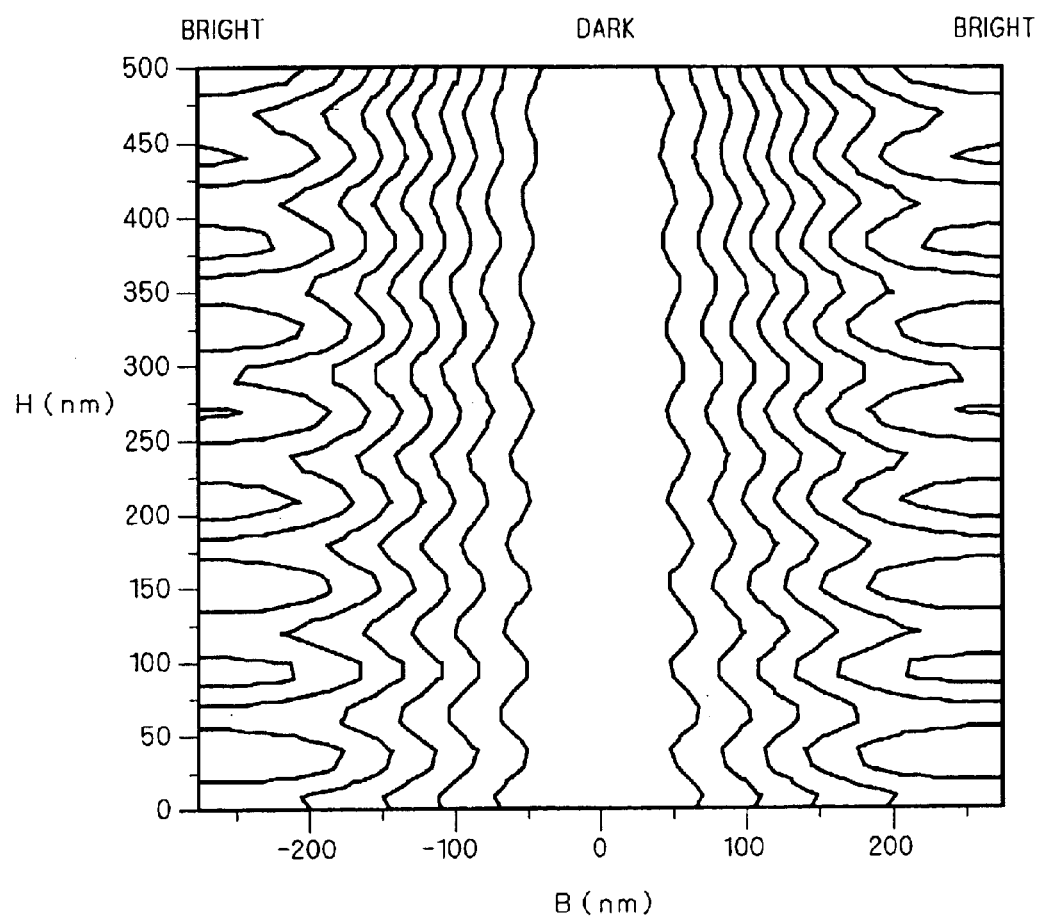

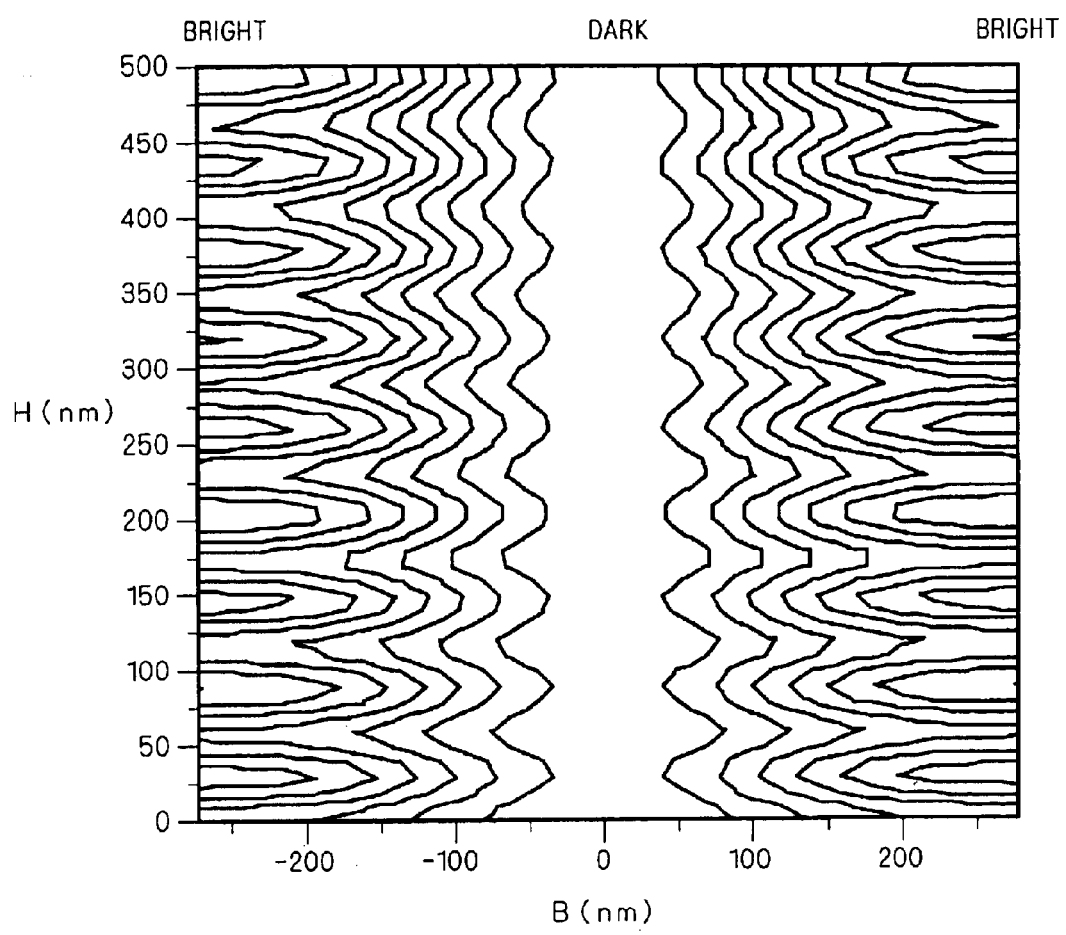

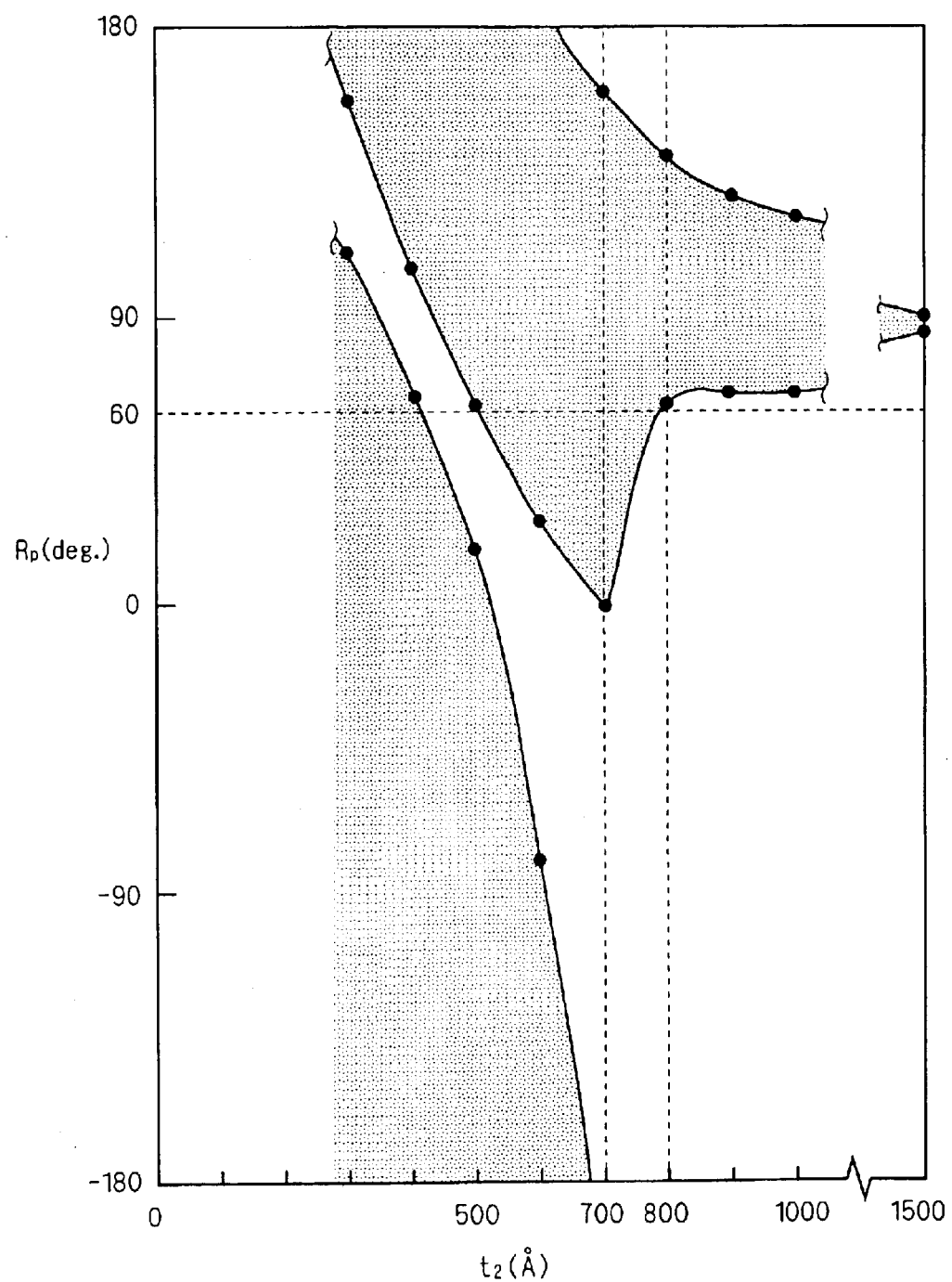

F I G . 1 2
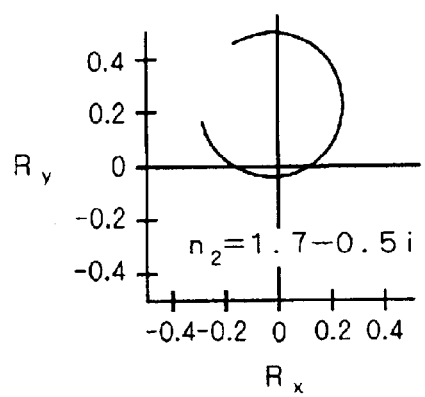
F I G . 1 3
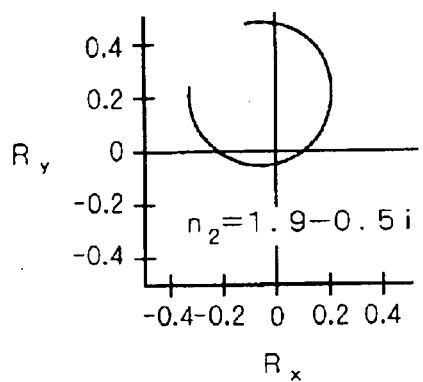
F I G . 1 4
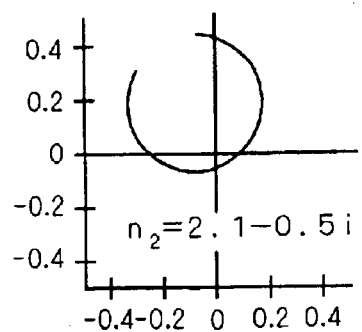

F I G . 2 4
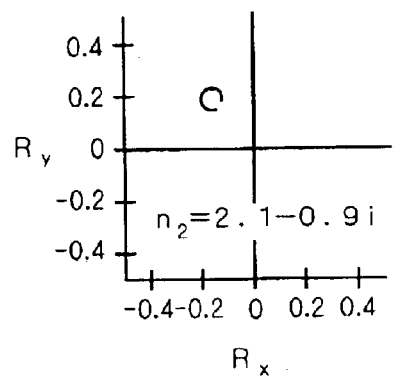
F I G . 2 5
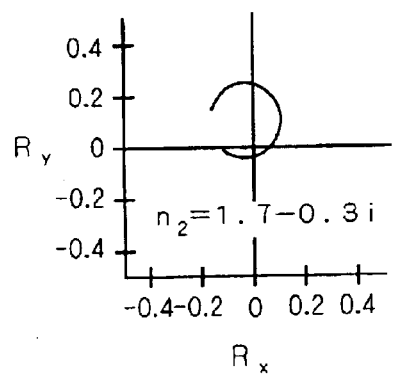
F I G . 2 6
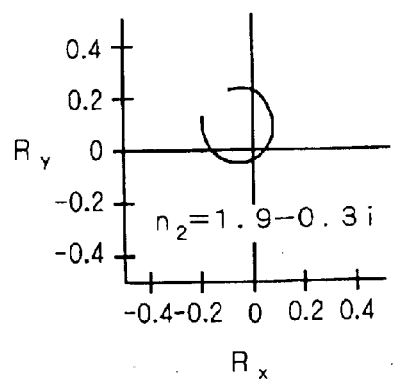

US 6,916,749 B2

METHOD OF MANUFACTURING SEMICONDUCTOR DEVICE

BACKGROUND OF THE INVENTION

1. Field of the Invention

The present invention relates to a method of manufacturing a semiconductor device.

2. Description of the Background Art

Conventionally, a photoresist has been used as a mask for a patterning process in a micromachining process such as a semiconductor device processing. To be usable as a mask having a desired configuration, such a photoresist itself is subjected to a patterning process. During a patterning process on a photoresist, an anti-reflective film is occasionally interposed between the photoresist and an underlying layer which is underlying the photoresist and is to be patterned using the patterned photoresist, in order to prevent reflection from occurring at an interface between the photoresist and the underlying layer.

The foregoing technique is described in Japanese Patent Application Laid-Open Nos. 7-37799, 10-270329 and 2002-214793, for example.

In accordance with conventional practices, a range of feature of the anti-reflective film has been determined so as to reduce an absolute value of a reflection coefficient. There has never been presented a technique for determine a range of feature which provides for optimization of a configuration of a patterned and remaining photoresist.

SUMMARY OF THE INVENTION

It is an object of the present invention to provide a method of manufacturing a semiconductor device which provides for optimization of a configuration of a patterned and remaining photoresist.

A first method of manufacturing a semiconductor device the following steps (a), (b), (i) and (ii). The step (a) is to form an anti-reflective film on an underlying layer. The step (b) is to form a positive photoresist to be patterned on the anti-reflective film. Light for exposure is incident through the positive photoresist. The step (i) is to determine a range of feature of at lease one of the anti-reflective film and the underlying layer so as to allow an absolute value of a reflection coefficient of the light at an interface between the anti-reflective film and the positive photoresist to be equal to or smaller than a first value. The step (ii) is to delimit the range determined in the step (i) so as to allow an absolute value of a phase of the reflection coefficient to be equal to or larger than a second value.

A second method of manufacturing a semiconductor device the following steps (a), (b), (i) and (ii). The step (a) is to form an anti-reflective film on an underlying layer. The step (b) is to form a negative photoresist to be patterned on the anti-reflective film. Light for exposure is incident through the negative photoresist. The step (i) is to determine a range of feature of at lease one of the anti-reflective film and the underlying layer so as to allow an absolute value of a reflection coefficient of the light at an interface between the anti-reflective film and the negative photoresist to be equal to or smaller than a first value. The step (ii) is to delimit the range determined in the step (i) so as to allow an absolute value of a phase of the reflection coefficient to be equal to or smaller than a second value.

By the step (i), it is possible to determine the range of feature which provides for reduction in an intensity of reflected light. Further, by the step (ii), it is possible to delimit the range of feature so as not to allow an undercut to easily occur in a configuration of the photoresist as patterned. Accordingly, the patterned photoresist does not easily collapse.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5 through 10 are graphs each showing a distribution of an amount of light in a photoresist.

FIG. 11 is a graph showing a phase of an interface reflection coefficient according to a first preferred embodiment of the present invention.

FIGS. 12 through 31 are graphs each showing an interface reflection coefficient according to a second preferred embodiment of the present invention.

DESCRIPTION OF THE PREFERRED EMBODIMENTS

Preferred Embodiments

Basic Concept of the Present Invention

Prior to describing various specific preferred embodiments of the present invention, a basic concept of the present invention will be explained. It is additionally noted that the scope of the present invention encompasses the following basic concept, of course.

Figure 1:
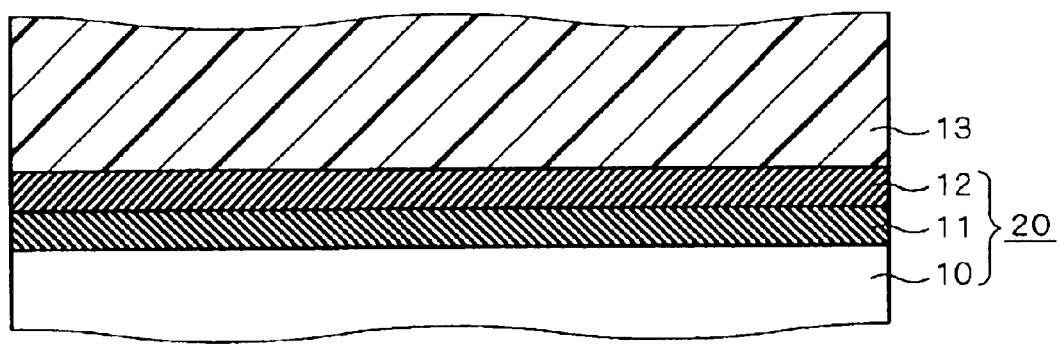
FIG. 1 is a sectional view of a multilayer structure which is used for explanation of a basic concept of the present invention.

FIG. 1 is a sectional view of a structure including a multilayer structure 20 and a positive photoresist 13 disposed on the multilayer structure 20, which will be used for explanation of the basic concept of the present invention. The multilayer structure 20 includes polysilicon 10, a silicon oxide film 11 and an anti-reflective film 12 which are deposited sequentially in the order noted, and the photoresist 13 is formed on the anti-reflective film 12. The multilayer structure 20 is employed for formation of a gate electrode by reshaping the polysilicon 10, during manufacture of a MOS transistor, for example.

The photoresist 13 is an object to be first patterned, and a remaining portion of the photoresist 13 after patterned functions as a mask used for patterning the anti-reflective film 12 and the silicon oxide film 11.

In the multilayer structure 20 with the photoresist 13 described above, light for exposure is incident upon the multilayer structure 20, having been transmitted through the photoresist 13. A reflection coefficient of such light at an interface between the photoresist 13 and the anti-reflective film 12 (hereinafter, referred to as an "interface reflection coefficient") is calculated, more specifically, an absolute value $R_a$, a phase $R_p$, a real part $R_x$ and an imaginary part $R_y$ of the interface reflection coefficient are calculated, based on the following equations. It is noted that although a gate oxide film and a silicon substrate are typically provided under the polysilicon 10 when forming a gate electrode by reshaping the polysilicon 10 during manufacture of a MOS transistor, the following equations are formulated on the assumption that a thickness of the polysilicon 10 is infinite for good reasons that the polysilicon 10 has a high light absorption index and a large thickness, as generally known.

$$r_s = \frac{n_1 - n_s}{n_1 + n_s}$$

$$r_1 = \frac{n_2 - n_1}{n_2 + n_1}$$

$$r_2 = \frac{n_t - n_2}{n_t + n_2}$$

$$\delta_1 = \exp[-i(4\pi t_1 n_1/\lambda)]$$

$$\delta_2 = \exp[-i(4\pi t_2 n_2/\lambda)]$$

$$\xi_1 = \frac{r_1 + r_s \cdot \delta_1}{1 + r_1 \cdot r_s \cdot \delta_1}$$

$$\xi_2 = \frac{r_2 + \xi_1 \cdot \delta_2}{1 + r_2 \cdot \xi_1 \cdot \delta_2}$$

$$R_a = |\xi_2|^2$$

$$R_p = \tan^{-1}(R_y/R_x)$$

$$R_x = Re(\xi_2)$$

$$R_y = Im(\xi_2)$$

In the above equations: "$n_s$", "$n_1$", "$n_2$" and "$n_t$" represent respective complex refractive indices of the polysilicon 10, the silicon oxide film 11, the anti-reflective film 12 and the photoresist 13; "$t_1$" and "$t_2$" represent respective thicknesses of the silicon oxide film 11 and the anti-reflective film 12; and "$\lambda$" represents a wavelength of light for exposure. As readily appreciated from the above equations, the interface reflection coefficient does not depend on the thickness of the photoresist 13 which is an uppermost layer of the entire structure (i.e., the multilayer structure 20 with the photoresist 13).

When an ArF laser is employed as light for exposure, for example, the wavelength $\lambda$ is 193 nm. Alternatively, an $F_2$ laser (having a wavelength of 157 nm) or a KrF laser (having a wavelength of 248 nm) can be employed. The respective complex refractive indices $n_s$ and $n_1$ of the polysilicon 10 and the silicon oxide film 11 are 0.97–2.10i and 1.56, respectively, where "i" represents a unit of an imaginary number (such representation will be applicable throughout the present specification). As for the anti-reflective film 12, when an inorganic material such as plasma silicon nitride oxide is employed for forming the anti-reflective film 12, its complex refractive index $n_2$ becomes 1.9–0.5i. Also, as for the photoresist 13, as a positive photoresist is employed as the photoresist 13, its complex refractive index $n_t$ is assumed to be 1.7–0.02i, for example. Those values cited above will be employed as constants throughout the present specification unless otherwise noted.

Assuming that the thickness $t_2$ of the anti-reflective film 12 is fixed, the thickness $t_1$ of the silicon oxide film 11 which allows the photoresist 13 to be appropriately patterned is obtained as follows.

Figure 2:
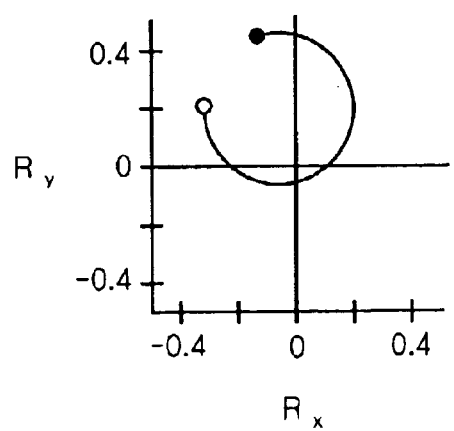
FIG. 2 is a graph showing a reflection coefficient at an interface ("interface reflection coefficient").

FIG. 2 is a graph showing a curve formed by tracing coordinates of the real part $R_x$ and the imaginary part $R_y$ of the interface reflection coefficient, respectively, which vary in accordance with variation in the thickness $t_1$ of the silicon oxide film 11 in a range from 300 to 800 Å. A black point in the graph represents a situation where $t_1$ is 300 Å, while a white point represents a situation where $t_1$ is 800 Å. A value (coordinates) ($R_x$, $R_y$) in the graph moves in a clockwise direction as the thickness $t_1$ increases.

Figure 3:
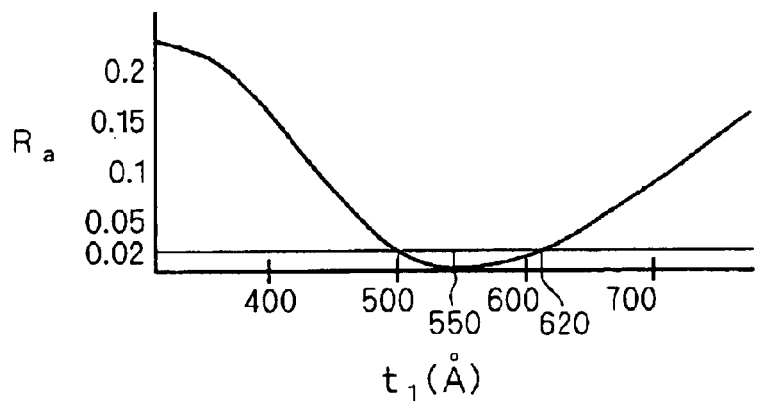
FIG. 3 is a graph showing an absolute value of an interface reflection coefficient.
Figure 4:
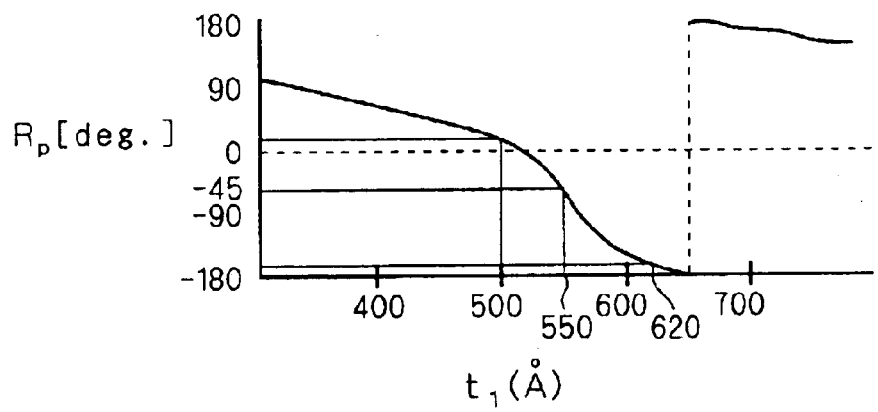
FIG. 4 is a graph showing a phase of an interface reflection coefficient.
Figure 5:
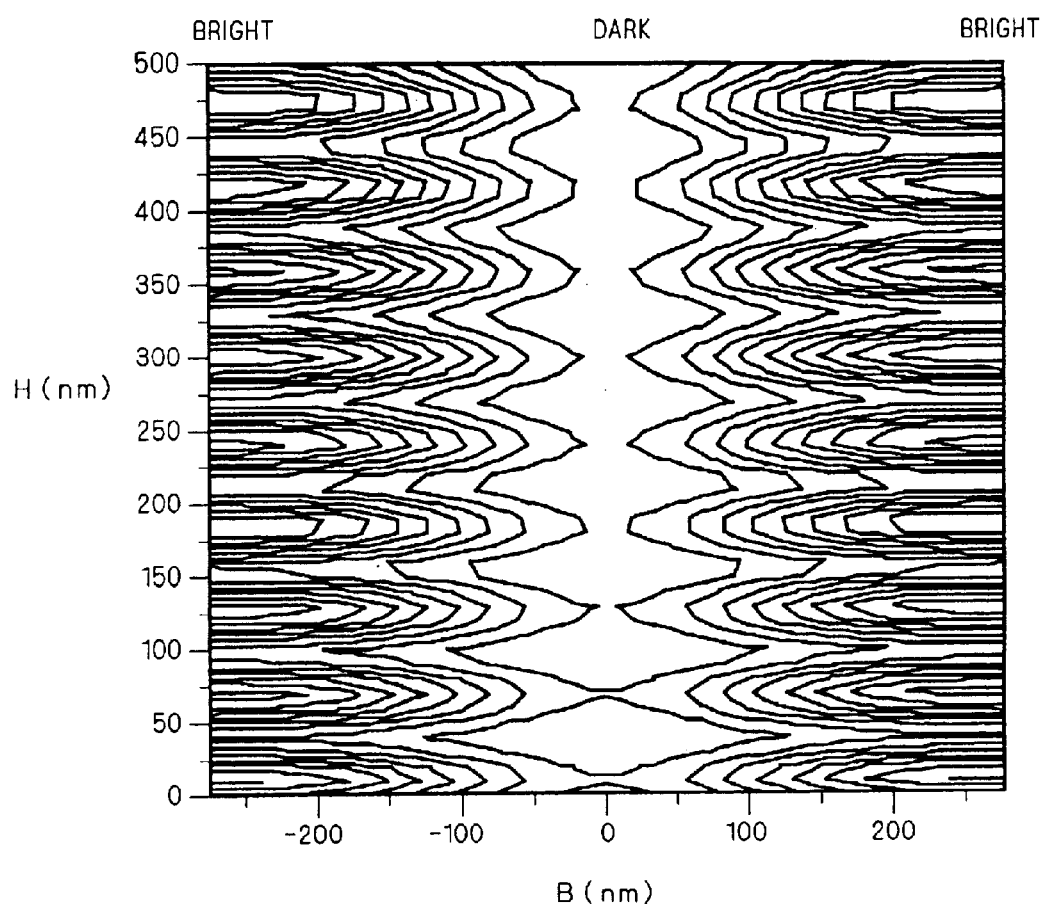
Figure 6:
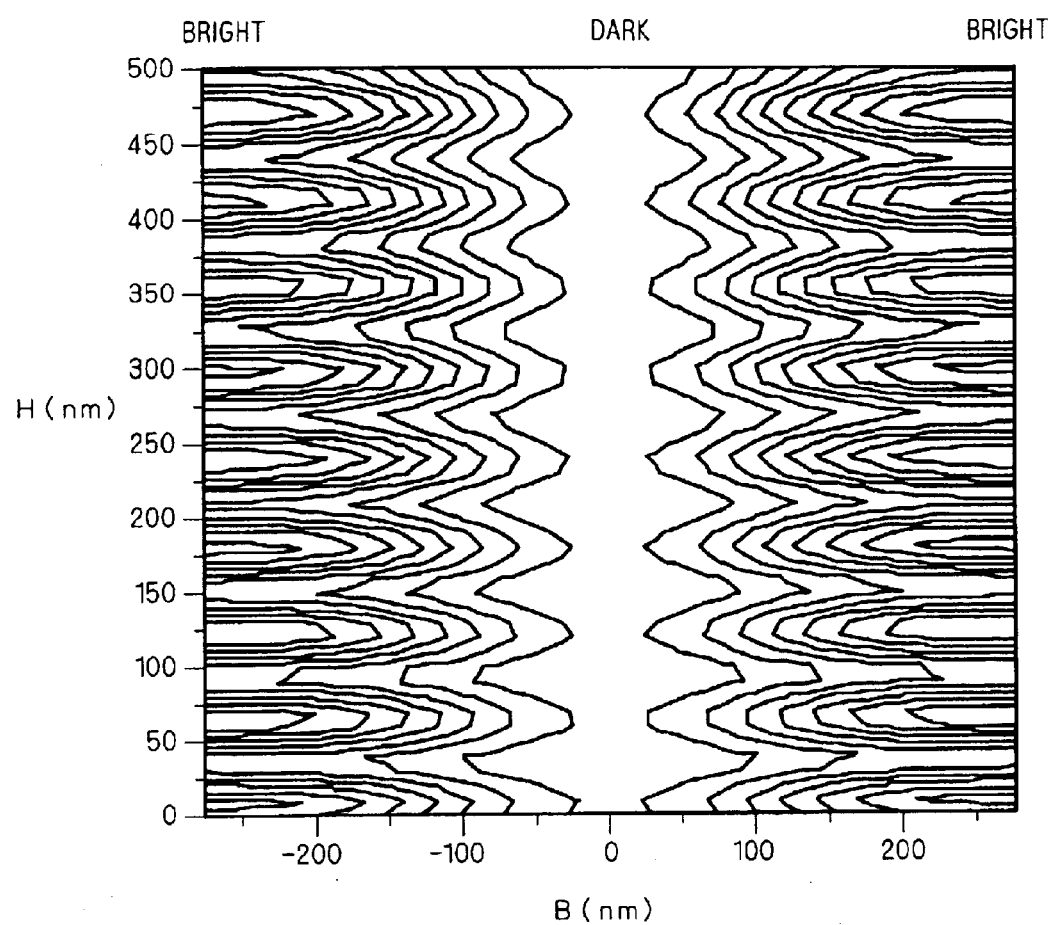
Figure 7:
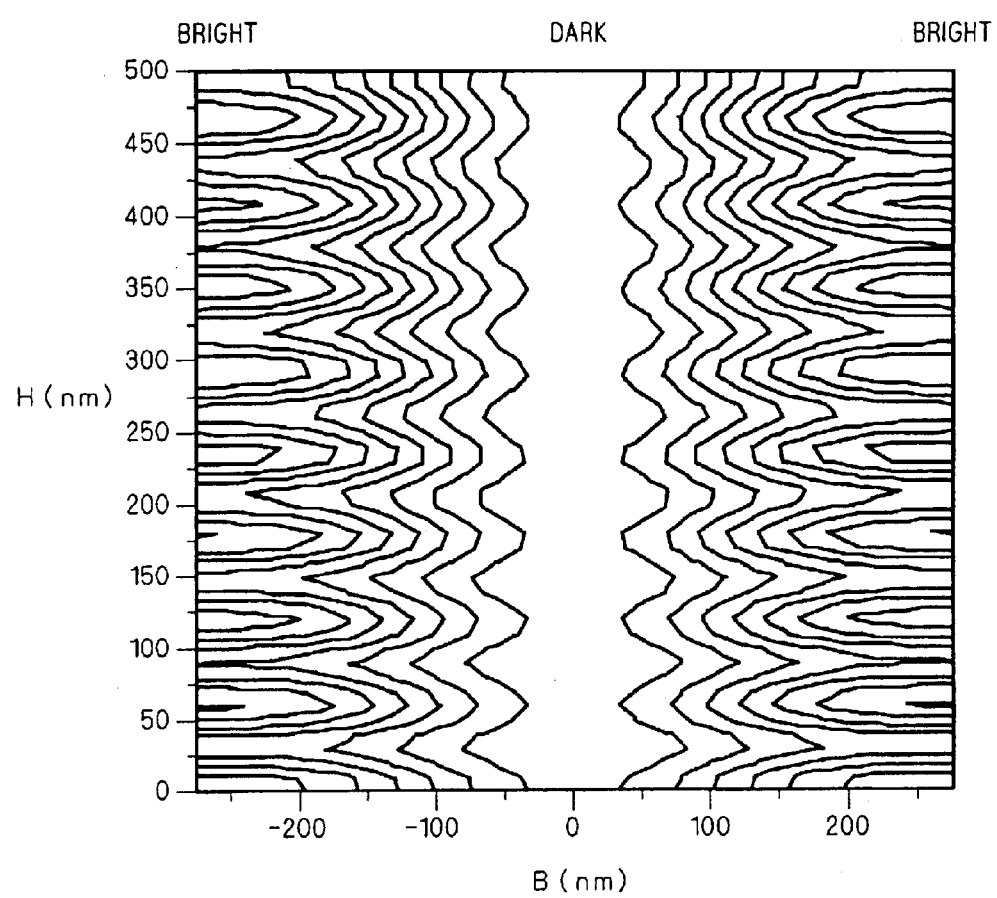
Figure 8:
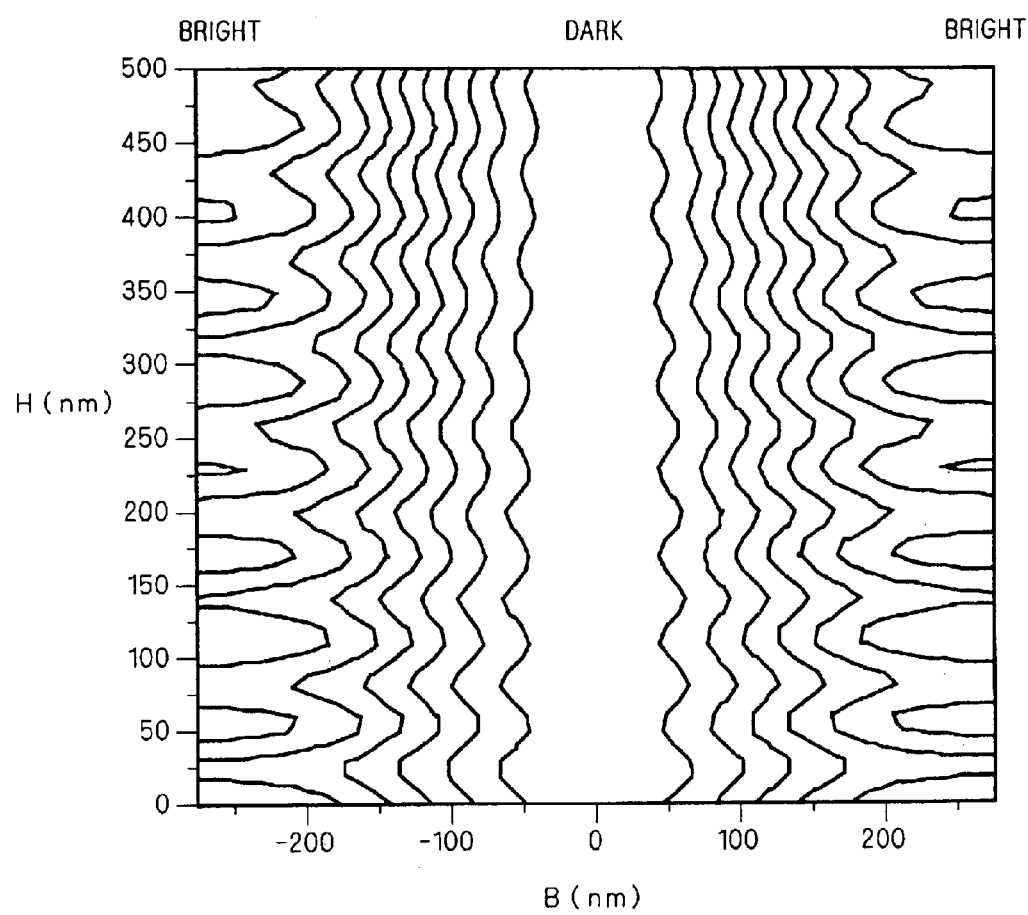

FIG. 3 is a graph showing dependence of the absolute value $R_a$ of the interface reflection coefficient upon the thickness $t_1$, and FIG. 4 is a graph showing dependence of the phase $R_p$ of the interface reflection coefficient upon the thickness $t_1$. Generally, it is desirable that the absolute value $R_a$ of the interface reflection coefficient is equal to or smaller than approximately 0.02. To take this fact into account, the thickness $t_1$ of the silicon oxide film 11 should be determined in a range from approximately 500 to 620 Å. Meanwhile, actual experiments have revealed that it is impossible to shape the photoresist 13 into an appropriate configuration by means of pattering using a photolithography technique when the thickness $t_1$ is in a range from 500 to 550 Å. More specifically, it has been revealed that when the thickness $t_1$ of the photoresist 13 is in a range from 500 to 550 Å, an undercut occurs in a bottom portion (in other words, a portion in contact with the anti-reflective film 12) of the photoresist 13 after patterned.

Occurrence of an undercut in a bottom portion of the patterned photoresist 13 causes the photoresist 13 to easily collapse, which is particularly prominent when the photoresist 13 is finely patterned. It is supposed that such collapse of the photoresist 13 is directly caused by decrease in a contact area between the photoresist 13 and the anti-reflective film 12, as well as impregnation of a developer into the photoresist 13 due to a capillary action. In the experiments, collapse of the patterned photoresist 13 was frequently observed when the photoresist 13 with the thickness $t_1$ of 550 Å or smaller was patterned into a configuration having a width of 140 nm.

On the other hand, an undercut hardly occurred in a bottom portion of the patterned photoresist 13 when the photoresist 13 with the thickness $t_1$ larger than 550 Å was used. From the above-noted experimental results, it is supposed that there is a need of optimizing a factor other than the absolute value $R_a$ in the interface reflection coefficient, in order to have the photoresist 13 appropriately patterned.

While the absolute value $R_a$ of the interface reflection coefficient is determined to be equal to or smaller than approximately 0.02, the phase $R_p$ of the interface reflection coefficient varies according to a range of the thickness $t_1$.

Specifically, the phase $R_p$ is larger than approximately −45° when the thickness $t_1$ is in a range from 500 to 550 Å, and the phase $R_p$ is smaller than approximately −45° when the thickness $t_1$ is larger than 550 Å. Hence, it is supposed that the phase $R_p$ of the interface reflection coefficient is the factor to be optimized for having the photoresist 13 appropriately patterned, other than the absolute value $R_a$ in the interface reflection coefficient.

More specifically, as the phase $R_p$ of the interface reflection coefficient becomes closer to 0 (in other words, an absolute value of the phase $R_p$ decreases), incident light and reflected light produced by light for exposure intensify each other between the photoresist 13 and the silicon oxide film 11 to a greater extent. This would result in exposure of undesired portions of the photoresist 13 which are covered with a photomask, to allow an undercut to occur in corresponding portions. To the contrary, as the phase $R_p$ of the interface reflection coefficient becomes farther from 0 (in other words, an absolute value of the phase $R_p$ increases), incident light and reflected light produced by light for exposure weaken each other between the photoresist 13 and the silicon oxide film 11 to a greater extent, in which case an undercut is unlikely to occur. To confirm the foregoing suppositions, amounts of light in the photoresist 13 in various situations were obtained by simulation, which will be described below.

Each of FIGS. 5 through 10 is a graph showing a distribution of an amount of light in the photoresist 13 with a thickness of 500 nm. The graphs of FIGS. 5 through 10 show results in respective situations where the thickness $t_1$ of the silicon oxide film 11 is equal to 400 Å, 450 Å, 500 Å, 550 Å, 600 Å and 650 Å. A vertical axis of each graph represents a distance H (nm) between from the anti-reflective film 12 to an arbitrary portion of the photoresist 13, and a horizontal axis of the graph represents a distance B (nm) from a center of a line mask used for exposure of the photoresist 13 to an arbitrary portion of the photoresist 13, in a direction along a width of the line mask. The width of the line mask is 160 nm so that the line mask is disposed so as to allow the distance B to fall within a range from −80 to 80 (nm). Further, each simulation is carried out under conditions that a numerical aperture of a lens used for exposure is 0.60, an aperture of an irradiation light source is of a ½-annular type (δ=0.70), and a binary mask is employed as a photomask. Each graph of FIGS. 5 through 10 contains lines each formed by connecting points of equal amount of light in the photoresist 13 (hereinafter, referred to as "light contour lines"). In a lateral direction of each graph, a portion closer to a center of the graph (at which B=0) indicates a smaller amount of light, i.e., being darker, while a portion closer to either edge of the graph indicates a larger amount of light, i.e., being brighter. It should be noted that while a space between every two adjacent light contour lines represents a predetermined difference in amount of light in each graph of FIGS. 5 through 10 respective differences in amount of light in FIGS. 5 through 10 are not drawn to the same scale.

Whether or not an undercut occurs in a bottom portion of the photoresist 13 depends on a distribution of brightness (light) provided in the vicinity of a position where the distance H is 0. The reason for it is that as the photoresist 13 is a positive photoresist, a portion of the photoresist 13 which receives light in a predetermined amount or more starts to be dissolved while another portion of the photoresist 13 which receives light in an amount smaller than the predetermined amount remains, during a developing process. A threshold amount of light (i.e., the predetermined amount of light) at which the photoresist starts to be dissolved varies, of course.

As shown in FIGS. 5 through 10 each of the light contour lines repeatedly traces between relative maximum values and relative minimum values of the distance B while the distance H increases or decreases. This is because incident light and reflected light produced by light for exposure interfere with each other in the photoresist 13. When the distance B takes a value at which the light contour lines are close to a relative minimum value of the distance B in the vicinity of a position where the distance H is 0, the photoresist 13 is patterned into a configuration including an undercut in a bottom portion thereof. For example, referring to FIGS. 5 through 8, the light contour lines are closer to a relative minimum value of the distance B as compared to a relative maximum value in the vicinity of a position where the distance H is 0.

In contrast, referring to FIGS. 9 and 10, the light contour lines are closer to a relative maximum value of the distance B as compared to a relative minimum value in the vicinity of a position where the distance H is 0. Under a condition which can produce a distribution of an amount of light shown in each graph of FIGS. 9 and 10, an undercut is unlikely to occur in a bottom portion of the photoresist 13.

As shown in FIG. 4, the photoresist 13 easily collapses when an absolute value of the phase $R_p$ of the interface reflection coefficient is equal to or smaller than approximately 45°, and the photoresist 13 does not easily collapse when an absolute value of the phase $R_p$ of the interface reflection coefficient is larger than approximately 45°. Taking this correlation into account, it is desirable to design the multilayer structure 20 as follows. First, as a step (i), a range of feature such as a thickness, for example, of at least one of (the terms "at least one of" encompasses respective meanings of "either one of" and "both of") the anti-reflective film 12 and the silicon oxide film 11 is determined so as to allow the absolute value $R_a$ of the interface reflection coefficient to be equal to or smaller than a first value. In an instance employing the above-cited constants, a range of the thickness $t_1$ of the silicon oxide film 11 is determined to be approximately 500 to 620 Å so that the absolute value $R_a$ of the interface reflection coefficient can become equal to or smaller than 0.02. Next, as a step (ii), the range of feature determined in the above step (i) is delimited so as to allow an absolute value of the phase $R_p$ of the interface reflection coefficient to be equal to or larger than a second value. In the instance employing the above-cited constants, the range of the thickness $t_1$ of the silicon oxide film 11 determined in the above step (i) is delimited to be approximately 600 to 620 Å so that an absolute value of the phase $R_p$ of the interface reflection coefficient can become larger than approximately 45°. In this manner, it is possible to first determine a range of feature which provides for reduction in intensity of reflected light by the step (i), and then delimit the range of feature as determined in the step (i) so as not to allow an undercut to easily occur in a configuration of the patterned photoresist 13, by the step (ii). Accordingly, the photoresist 13 as patterned with the steps (i) and (ii) having been carried out does not easily collapse.

First Preferred Embodiment

A first preferred embodiment will describe a procedure for determining the thickness of the anti-reflective film 12 which can be employed in the method of manufacturing a semiconductor device according to the present invention. FIG. 11 is a graph showing a relationship between the phase $R_p$ of the interface reflection coefficient and the thickness $t_2$ of the anti-reflective film 12, which varies in accordance with variation in the thickness $t_1$ of the silicon oxide film 11. In the first preferred embodiment, it is assumed that the complex reflective index $n_2$ of the anti-reflective film 12 is 1.71−0.41i, which can be obtained by employing an organic material for forming the anti-reflective film 12, for example. It is difficult to keep the thickness $t_1$ of the silicon oxide film 11 constant, irrespective of its location, during manufacture of a semiconductor device in not a little instances, where an organic material is typically employed for forming the anti-reflective film 12.

Hatched regions in the graph of FIG. 11 represent a range where the phase $R_p$ of the interface reflection coefficient can vary in a situation where the thickness $t_1$ of the silicon oxide film 11 is in a range from 300 to 800 Å. A black point represents a value resulting from simulation in which the thickness $t_1$ of the silicon oxide film 11 is determined to be 300 Å or 800 Å.

As shown in FIG. 11, when the thickness $t_2$ of the anti-reflective film 12 is equal to or smaller than 700 Å, the phase $R_p$ of the interface reflection coefficient varies greatly in accordance with variation in the thickness $t_1$ of the silicon oxide film 11. Accordingly, when the thickness $t_2$ of the anti-reflective film 12 is equal to or smaller than 700 Å, it is desirable to control the thickness $t_1$ of the silicon oxide film 11 in the same manner as explained in the above section of "Basic Concept of The Present Invention", in order to increase an absolute value of the phase $R_p$ of the interface reflection coefficient.

On the other hand, as the thickness $t_2$ of the anti-reflective film 12 increases from 700 Å to 800 Å, dependence of the phase $R_p$ of the interface reflection coefficient upon the thickness $t_1$ of the silicon oxide film 11 drastically reduces. More specifically, when the thickness $t_2$ of the anti-reflective film 12 is equal to or larger than 800 Å, the phase $R_p$ of the interface reflection coefficient is kept equal to or larger than 60°, independently of the thickness $t_1$ of the silicon oxide film 11. Accordingly, when the thickness $t_2$ of the anti-reflective film 12 is equal to or larger than 800 Å, there is no need of controlling the thickness $t_1$ of the silicon oxide film 11 in an attempt to increase an absolute value of the phase $R_p$ of the interface reflection coefficient. In other words, in the event that a multilayer structure which does not allow control of the thickness $t_1$ of the silicon oxide film 11 is used, it is possible to prevent the patterned photoresist 13 from collapsing by determining the thickness $t_2$ of the anti-reflective film 12 to be equal to or larger than approximately 800 Å.

Second Preferred Embodiment

A second preferred embodiment will describe a procedure for determining the complex refractive index $n_2$ of the anti-reflective film 12, which can be employed in the method of manufacturing a semiconductor device according to the present invention. Each of FIGS. 12 through 31 is a graph showing a curve formed by tracing coordinates of the real part $R_x$ and the imaginary part $R_y$ of the interface reflection coefficient (hereinafter, referred to as a "curve of the real part $R_x$ and the imaginary part $R_y$"), which vary in accordance with variation in the thickness $t_1$ of the silicon oxide film 11 in a range from 300 to 800 Å. In each of the graphs, the thickness $t_1$ of the silicon oxide film 11 is determined to be in a range from 300 to 800 Å, and a value (coordinates) $(R_x, R_y)$ moves in a clockwise direction as the thickness $t_1$ increases.

In each of the graphs of FIGS. 12 through 31, a value of the complex refractive index $n_2$ employed in each simulation is supplementarily noted. The following description will be made on the assumption that the complex refractive index $n_2$ is expressed as $\alpha - \beta i$ (wherein each of $\alpha$ and $\beta$ is a real number).

As generally known, to employ an organic material for forming the anti-reflective film 12 would allow control of a complex refractive index thereof. A real part and an imaginary part of a complex refractive index of an organic material are governed by a polymer and a dye used in the organic material, respectively.

Each graph of FIGS. 12 through 18 shows a result in a situation where the thickness $t_2$ of the anti-reflective film 12 is 300 Å, each graph of FIGS. 19 through 24 shows a result in a situation where the thickness $t_2$ of the anti-reflective film 12 is 500 Å, and each graph of FIGS. 25 through 31 shows a result in a situation where the thickness $t_2$ of the anti-reflective film 12 is 800 Å. In preparation for the step (ii) above explained, it is desirable to make an angle between the curve of the real part $R_x$ and the imaginary part $R_y$ and an axis of a positive real number as large as possible.

(1) In a situation where the thickness $t_2$ of the anti-reflective film 12 is 300 Å.

As readily appreciated from FIGS. 12 through 14, when the value $\beta$ is 0.5, the curve of the real part $R_x$ and the imaginary part $R_y$ intersects the axis of a positive real number even if the value a is increased. In other words, a range of the thickness $t_2$ of the anti-reflective film 12 which allows the phase $R_p$ of the interface reflection coefficient to be close to 0° falls within a range of 300 to 800 Å.

Figure 15:
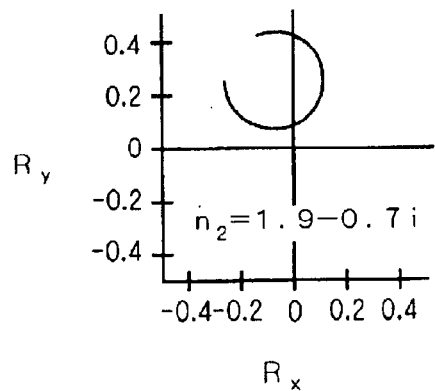
Figure 16:
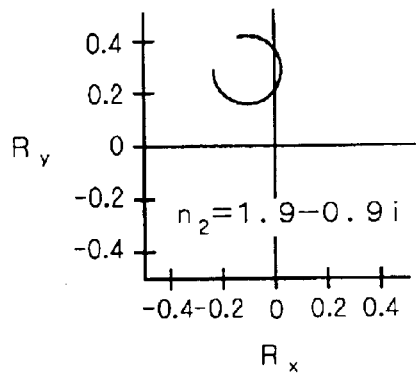
Figure 17:
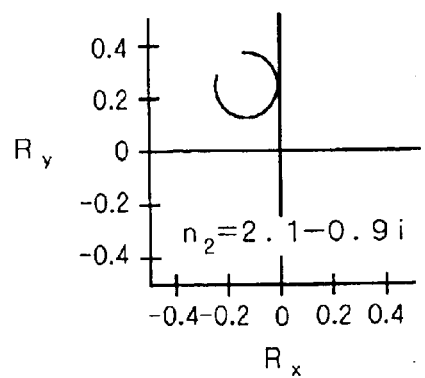
Figure 18:
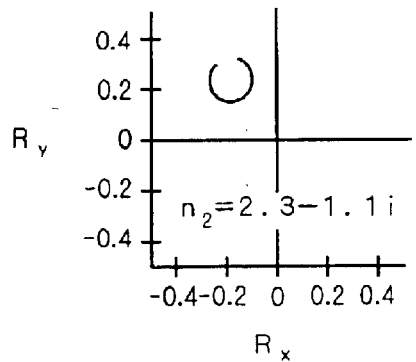

On the other hand, as readily appreciated from comparison between FIGS. 13, 15 and 16, as the value $\beta$ increases, an angle between the curve of the real part $R_x$ and the imaginary part $R_y$ and the axis of a positive real number increases. More specifically, it is supposed that collapse of the photoresist 13 can be prevented as far as the value $\beta$ is equal to or larger than 0.7. Further, as appreciated from FIGS. 16 through 18, when the value $\beta$ is equal to or larger than 0.9, it may be desirable to make the value $\alpha$ as large as possible. However, the value $\alpha$ will not so greatly affect the phase $R_p$ of the interface reflection coefficient as far as the value $\beta$ is equal to or larger than 0.7.

(2) In a situation where the thickness $t_2$ of the anti-reflective film 12 is 500 Å

Figure 19:
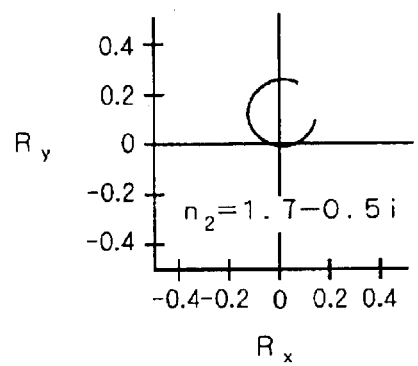
Figure 20:
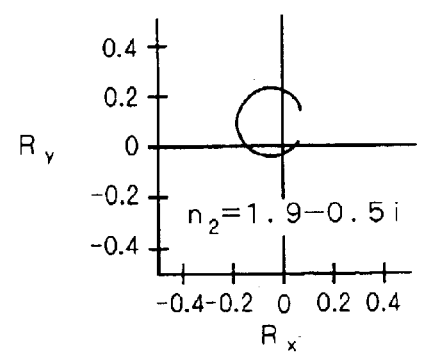
Figure 21:
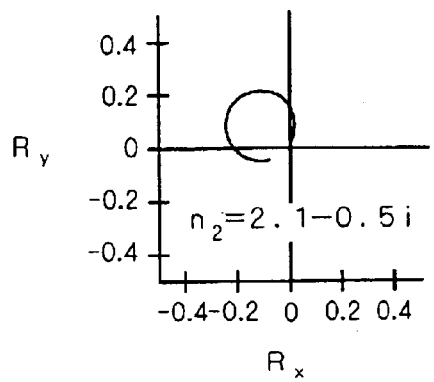

As readily appreciated from FIGS. 19 through 21, when the value $\beta$ is 0.5, the curve of the real part $R_x$ and the imaginary part $R_y$ intersects the axis of a positive real number if the value $\alpha$ is equal to or smaller than 1.9.

Figure 22:
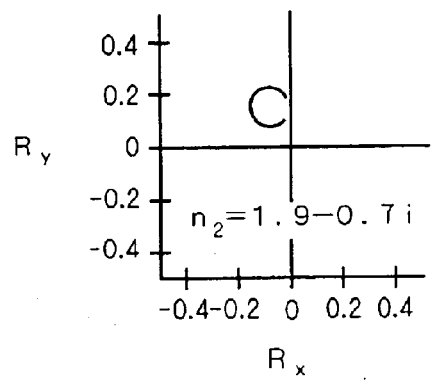
Figure 23:
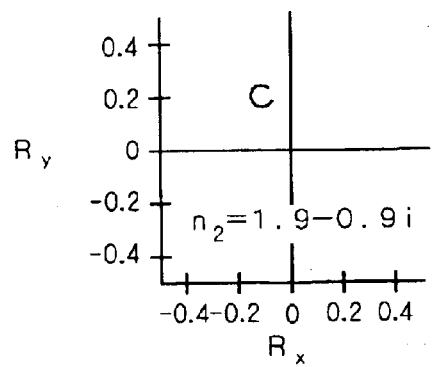

On the other hand, as readily appreciated from comparison between FIGS. 20, 22 and 23, as the value $\beta$ increases, an angle between the curve of the real part $R_x$ and the imaginary part $R_y$ and the axis of a positive real number increases. More specifically, it is supposed that collapse of the photoresist 13 can be prevented as far as the value $\beta$ is equal to or larger than 0.7. Further, as appreciated from FIGS. 23 and 24, when the value $\beta$ is equal to or larger than 0.9, it may be desirable to make the value $\alpha$ as large as possible. However, the value $\alpha$ will not so greatly affect the phase $R_p$ of the interface reflection coefficient as far as the value $\beta$ is equal to or larger than 0.7.

(3) In a situation where the thickness $t_2$ of the anti-reflective film 12 is 800 Å.

As readily appreciated from FIGS. 25 and 26, when the value $\beta$ is 0.3, the curve of the real part $R_x$ and the imaginary part $R_y$ intersects the axis of a positive real number even if the value $\alpha$ is increased.

Figure 27:
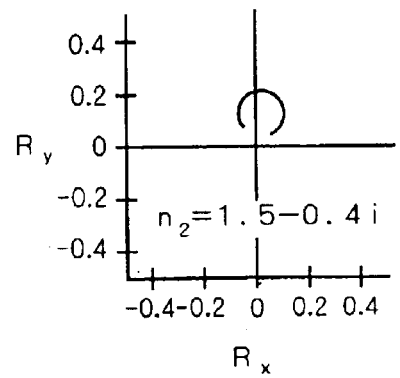
Figure 28:
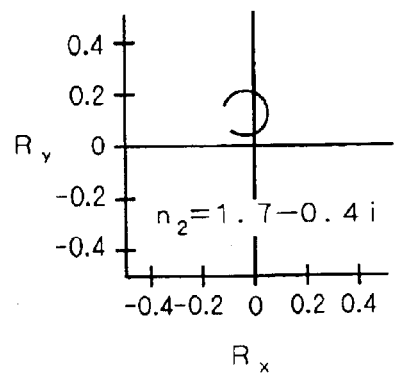
Figure 29:
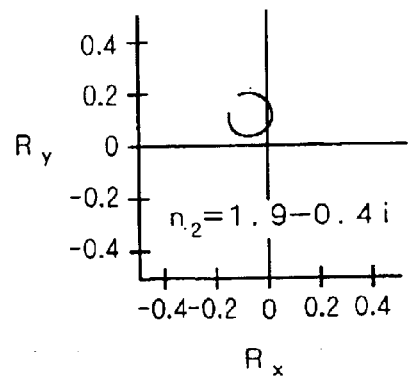
Figure 30:
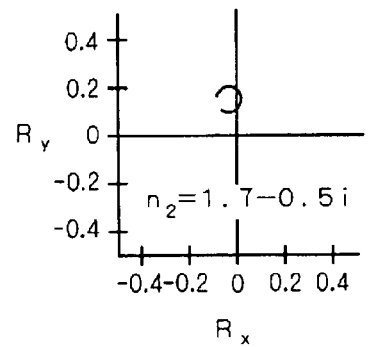
Figure 31:
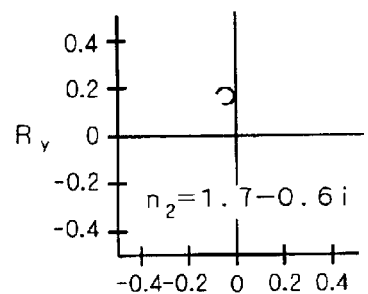

On the other hand, as readily appreciated from FIGS. 27 through 29, when the value $\beta$ is 0.4, the curve of the real part $R_x$ and the imaginary part $R_y$ does not intersect the axis of a positive real number if the value $\alpha$ is in a range from 1.5 to 1.9. Further, as appreciated from FIGS. 28, 30 and 31, as the value $\beta$ increases, an angle between the curve of the real part $R_x$ and the imaginary part $R_y$ and the axis of a positive real number increases. More specifically, it is supposed that collapse of the photoresist 13 can be prevented as far as the value β is equal to or larger than 0.4.

Results provided in the above noted situations (1), (2) and (3) make it clear that it is desirable to determine the value β to be equal to or larger than 0.7 when the thickness $t_2$ of the anti-reflective film 12 is equal to or smaller than 500 Å, and it is desirable to determine the value β to be equal to or larger than 0.4 when the thickness $t_2$ of the anti-reflective film 12 is equal to approximately 800 Å. In other words, it is desirable to increase the value β as the thickness $t_2$ of the anti-reflective film 12 decreases.

Third Preferred Embodiment

Figure 32:
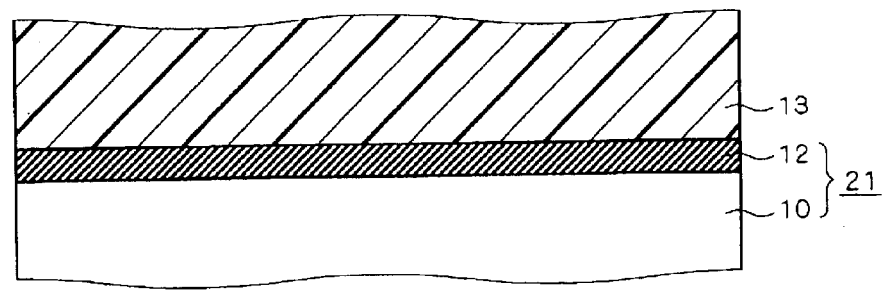
FIG. 32 is a sectional view illustrating a multilayer structure used in a third preferred embodiment of the present invention.

FIG. 32 is a sectional view of a structure including a multilayer structure 21 and the positive photoresist 13 provided on the multilayer structure 21, which is used in a third preferred embodiment. The multilayer structure 21 includes the polysilicon 10 and the anti-reflective film 12 which are deposited sequentially in the order noted, and the photoresist 13 is provided on the anti-reflective film 12. Also in the foregoing structure (the multilayer structure 21 with the photoresist 13) of the third preferred embodiment, it is possible to prevent collapse of the patterned photoresist 13 by controlling the thickness $t_2$ and the complex refractive index $n_2$ of the anti-reflective film 12 in the same manner as described above. However, the multilayer structure 21 differs from the multilayer structure 20 in that it does not include the silicon oxide film 11. As such, calculation of the interface reflection coefficient is carried out on the assumption that the thickness $t_1$ of the silicon oxide film 11 is 0. Additionally, the third preferred embodiment will describe simulation carried out on the assumption that an organic material is employed for the anti-reflective film 12 so that the complex refractive index $n_2$ is 1.71–0.41i.

Figure 33:
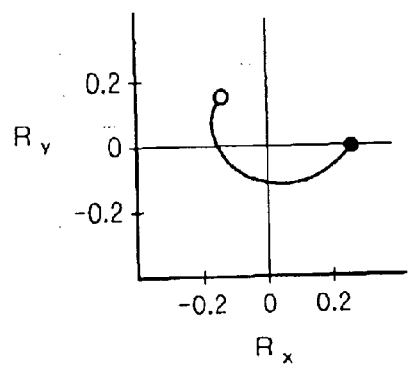
FIG. 33 is a graph showing an interface reflection coefficient according to the third preferred embodiment of the present invention.

FIG. 33 is a graph of a curve of the real part $R_x$ and the imaginary part $R_y$ of the interface reflection coefficient, which is provided while the thickness $t_2$ of the anti-reflective film 12 is varied in a range from 200 to 500 Å. A black point in the graph represents a situation where $t_2$ is 200 Å, while a white point represents a situation where $t_2$ is 500 Å. A value (coordinates) ($R_x$, $R_y$) in the graph moves in a clockwise direction as the thickness $t_2$ increases.

Figure 34:
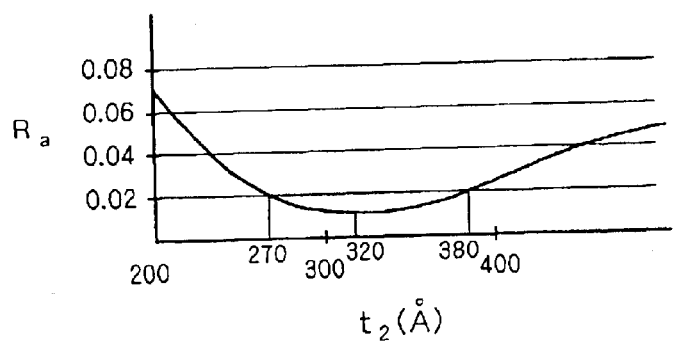
FIG. 34 is a graph showing an absolute value of the interface reflection coefficient according to the third preferred embodiment of the present invention.
Figure 35:
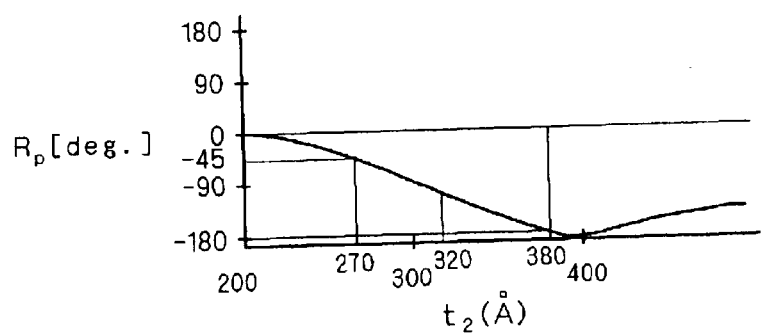
FIG. 35 is a graph showing a phase of the interface reflection coefficient according to the third preferred embodiment of the present invention.

FIG. 34 is a graph showing dependence of the absolute value $R_a$ of the interface reflection coefficient upon the thickness $t_2$, and FIG. 35 is a graph showing dependence of the phase $R_p$ of the interface reflection coefficient upon the thickness $t_2$. First, the above described step (i) is performed, in which a range of the thickness $t_2$ of the anti-reflective film 12 is determined to be approximately 270 to 380 Å so that the absolute value $R_a$ of the interface reflection coefficient is equal to or smaller than 0.02. In accordance with the conventional practices, the thickness $t_2$ would be determined to be equal to 320 Å which allows the absolute value $R_a$ of the interface reflection coefficient to be minimized.

As shown in FIG. 35, when the thickness $t_2$ of the anti-reflective film 12 is in a range of approximately 270 to 380 Å, an absolute value of the phase $R_p$ of the interface reflection coefficient is larger than approximately 45°, and increases as the thickness $t_2$ of the anti-reflective film 12 increases. Accordingly, in the above-described step (ii), the range of the thickness $t_2$ of the anti-reflective film 12 previously determined in the step (i) (i.e., a range of approximately 270 to 380 Å) can be employed without modification thereto.

However, in view of a respect that the polysilicon 10, not a silicon oxide film, is an object to be patterned in this preferred embodiment, it is desirable to make the thickness $t_2$ of the anti-reflective film 12 as small as possible. This is applicable to a case where silicide or metal, other than polysilicon, is used as a layer underlying the anti-reflective film 12 and is to be patterned. For this reason, the thickness $t_2$ of the anti-reflective film 12 is determined to be smaller than 320 Å which allows the absolute value $R_a$ of the interface reflection coefficient to be minimized. The thickness $t_2$ may be determined to be approximately 270 Å, for example. However, preferably, the thickness $t_2$ is determined to be approximately 300 Å to provide for further increase in an absolute value of the phase $R_p$ of the interface reflection coefficient.

Moreover, when an organic material is employed for forming the anti-reflective film 12, further attention may be required if an underlying layer has a projection and a depression. Specifically, if an underlying layer underlying the anti-reflective film 12 has a projection and a depression, the formed anti-reflective film 12 is liable to be thinner in a portion thereof which covers the projection of the underlying layer than in another portion thereof which covers a flat portion of the underlying layer. As shown in FIG. 35, an absolute value of the phase $R_p$ of the interface reflection coefficient decreases in accordance with decrease in the thickness $t_2$. Accordingly, an absolute value of a phase $R_p$ of a reflection coefficient at an interface between the photoresist 13 and the portion of the anti-reflective film 12 covering the projection of the underlying layer is smaller than that at an interface between the photoresist 13 and the portion of the anti-reflective film 12 covering the flat portion of the underlying layer. This causes the photoresist 13 as patterned to easily collapse. In view of this, when an organic material is employed for forming the anti-reflective film 12, it is preferable to determine the thickness $t_2$ to be larger than the value determined based on the above-described simulation, to avoid the foregoing problem due to a projection and a depression which may possibly be included in an underlying layer.

REFERENCE EXAMPLE

An example where an inorganic material such as plasma silicon nitride oxide is employed for forming the anti-reflective film 12 in the multilayer structure 21 will be described. In this example, the complex refractive index $n_2$ of the anti-reflective film 12 is 1.9–0.5i, and a better step coverage for an underlying layer can be exhibited.

Figure 36:
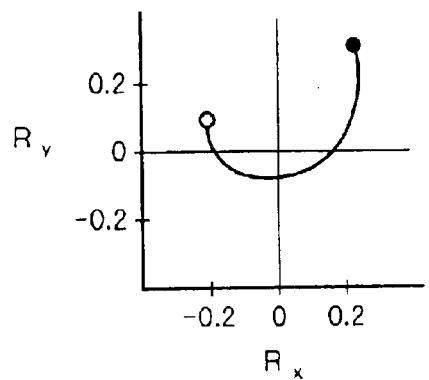
FIG. 36 is a graph showing an interface reflection coefficient according to a reference example.

FIG. 36 is a graph showing a curve of the real part $R_x$ and the imaginary part $R_y$ of the interface reflection coefficient, which is provided while the thickness $t_2$ of the anti-reflective film 12 is varied in a range from 100 to 400 Å. A black point in the graph represents a situation where $t_2$ is 100 Å, while a white point represents a situation where $t_2$ is 400 Å. A value (coordinates) ($R_x$, $R_y$) in the graph moves in a clockwise direction as the thickness $t_2$ increases.

Figure 37:
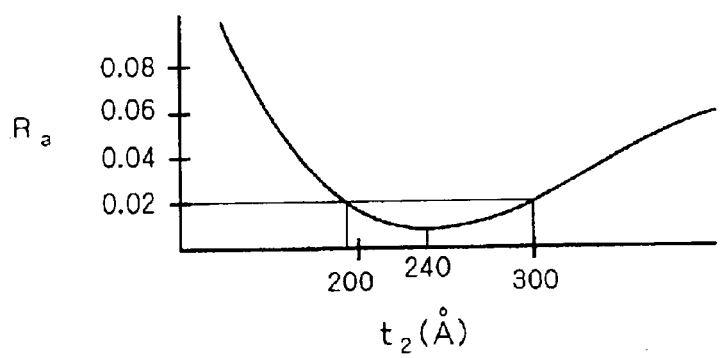
FIG. 37 is a graph showing an absolute value of the interface reflection coefficient according to the reference example.
Figure 38:
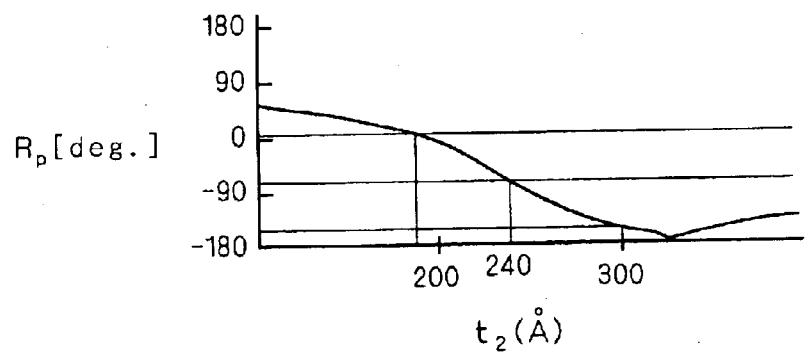
FIG. 38 is a graph showing a phase of an interface reflection coefficient according to the reference example.

FIG. 37 is a graph showing dependence of the absolute value $R_a$ of the interface reflection coefficient upon the thickness $t_2$, and FIG. 38 is a graph showing dependence of the phase $R_p$ of the interface reflection coefficient upon the thickness $t_2$. According to the present example, the thickness $t_2$ of the anti-reflective film 12 which allows the absolute value $R_a$ of the interface reflection coefficient to be minimized is approximately 240 Å. When the thickness $t_2$ is approximately 240 Å, an absolute value of the phase $R_p$ of the interface reflection coefficient becomes close to 90°. Accordingly, in the present example, the patterned photoresist 13 would not collapse even if the thickness $t_2$ of the anti-reflective film 12 is determined in accordance with the conventional practices.

Fourth Preferred Embodiment

The section of "Basic Concept of The Present invention" and the first to third preferred embodiments have been described on the assumption that the photoresist 13 is a positive photoresist. However, the photoresist 13 may alternatively be a negative photoresist. In such a case, an undercut easily occurs in a bottom portion of the photoresist 13 as patterned if the light contour lines are closer to a relative maximum value of the distance B as compared to a relative minimum value in the vicinity of a position where the distance H is 0, as readily appreciated by referring to FIGS. 5 through 10. As such, when a negative photoresist is employed as the photoresist 13, the above described step (ii) is modified. Specifically, a range of feature determined in the step (i) is delimited so as to allow an absolute value of the phase $R_p$ of the interface reflection coefficient to be equal to or smaller than the second value in the step (ii).

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:
   (a) forming an anti-reflective film on an underlying layer; and
   (b) forming a positive photoresist to be patterned on said anti-reflective film, light for exposure being incident through said positive photoresist,
   said method further comprising the steps of:
   (i) determining a range of a feature of at least one of said anti-reflective film and said underlying layer so as to allow an absolute value of a reflection coefficient of said light at an interface between said anti-reflective film and said positive photoresist to be equal to or smaller than a first value; and
   (ii) delimiting said range determined in said step (i) so as to allow an absolute value of a phase of said reflection coefficient to be equal to or larger than a second value.

2. The method of manufacturing a semiconductor device according to claim 1, wherein
   said second value is approximately 45° in said step (ii).

3. The method of manufacturing a semiconductor device according to claim 1, wherein
   said first value is approximately 0.02 in said step (i).

4. The method of manufacturing a semiconductor device according to claim 1, wherein
   a range of a thickness of said underlying layer is determined in said steps (i) and (ii) if said anti-reflective film has a thickness equal to a predetermined thickness or smaller.

5. The method of manufacturing a semiconductor device according to claim 1, wherein
   when said anti-reflective film has a complex refractive index which is expressed as $\alpha-\beta i$ where each of "$\alpha$" and "$\beta$" represents a real number and "i" represents a unit of an imaginary number, said $\beta$ is determined so as to increase as a thickness of said anti-reflective film decreases in said step (ii).

6. The method of manufacturing a semiconductor device according to claim 1, wherein
   when said underlying layer is made of any one of polysilicon, suicide and metal, said method further comprises the step of
   (iii) determining a thickness of said anti-reflective film to be smaller than a thickness which allows said absolute value of said reflection coefficient to be minimized, within said range delimited in said step (ii).

7. The method of manufacturing a semiconductor device according to claim 6, wherein
   when an organic material is employed for forming sail anti-reflective film, said thickness of said anti-reflective film is determined to be larger than that determined in said step (iii).

8. A method of manufacturing a semiconductor device comprising the steps of:
   (a) forming an anti-reflective film on an underlying layer; and
   (b) forming a negative photoresist to be patterned on said anti-reflective film, light for exposure being incident through said negative photoresist,
   said method further comprising the steps of:
   (i) determining a range of a feature of at least one of said anti-reflective film and said underlying layer so as to allow an absolute value of a reflection coefficient of said light at an interface between said anti-reflective film and said negative photoresist to be equal to or smaller than a first value; and
   (ii) delimiting said range determined in said step (i) so as to allow an absolute value of a phase of said reflection coefficient to be equal to or smaller than a second value.

* * * * *